(12) United States Patent
Piquette et al.

(10) Patent No.: US 8,334,646 B2
(45) Date of Patent: *Dec. 18, 2012

(54) LED WAVELENGTH-COVERTING PLATE WITH MICROLENSES IN MULTIPLE LAYERS

(75) Inventors: Alan Piquette, Peabody, MA (US); John Kelso, Exeter, NH (US); Nathan Zink, Salem, MA (US); John Nappi, Burlington, MA (US); Yi Zheng, Lynnfield, MA (US); Madis Raukus, Charlestown, MA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 78 days.

This patent is subject to a terminal disclaimer.

(21) Appl. No.: 12/891,281

(22) Filed: Sep. 27, 2010

(65) Prior Publication Data

US 2012/0074835 A1  Mar. 29, 2012

(51) Int. Cl.
- H01J 1/62 (2006.01)
- B05D 5/06 (2006.01)
- F21V 5/04 (2006.01)

(52) U.S. Cl. .................................. 313/501; 313/483

(58) Field of Classification Search .......... 313/483–487, 313/110, 498; 257/E31.11, E33.059
See application file for complete search history.

(56) References Cited

U.S. PATENT DOCUMENTS

| | | | |
|---|---|---|---|
| 6,956,247 B1 | 10/2005 | Stockman | |
| 7,341,878 B2 | 3/2008 | Krames et al. | |
| 7,361,938 B2 | 4/2008 | Mueller et al. | |
| 7,554,258 B2 | 6/2009 | Rossner et al. | |
| 2003/0020399 A1* | 1/2003 | Moller et al. | 313/504 |
| 2004/0145308 A1 | 7/2004 | Rossner et al. | |
| 2008/0116467 A1 | 5/2008 | Mueller et al. | |
| 2008/0121911 A1 | 5/2008 | Andrews et al. | |
| 2009/0206325 A1* | 8/2009 | Biwa et al. | 257/28 |
| 2010/0002449 A1* | 1/2010 | Lin | 362/311.01 |
| 2010/0046234 A1 | 2/2010 | Abu-Ageel | |
| 2010/0187976 A1 | 7/2010 | Winkler | |
| 2011/0162711 A1 | 7/2011 | Takeuchi et al. | |

FOREIGN PATENT DOCUMENTS

| | | |
|---|---|---|
| CN | 101826587 | 9/2010 |
| DE | 102004052456 | 4/2006 |
| JP | 2005-268323 | 9/2005 |
| WO | WO 2006/087651 | 8/2006 |
| WO | WO 2009/158158 | 12/2009 |
| WO | WO 2010/103840 | 9/2010 |

OTHER PUBLICATIONS

U.S. Appl. No. 12/891,315, filed Sep. 27, 2010.
Y.K. Lee et al., Enhanced extraction efficiency of Y2O3:Eu3+ thin-film phosphors coated with hexagonally close-packed polystyrene nanosphere monolayers, Applied Physics Letters 91, 041907 (2007) 041907-1-041907-3.

(Continued)

*Primary Examiner* — Anh Mai
*Assistant Examiner* — Elmito Breval
(74) *Attorney, Agent, or Firm* — Robet F. Clark

(57) ABSTRACT

A wavelength-converting plate for a wavelength-converted light emitting diode (LED) assembly. The wavelength-converting plate includes multiple layers of microlenses deposited thereon. The microlenses may have an index of refraction different from an index of refraction of the wavelength-converting plate.

14 Claims, 3 Drawing Sheets

OTHER PUBLICATIONS

Y.K. EE et al., Optimization of Light Extraction Efficiency of III-Nitride LEDs With Self-Assembled Colloidal-Based Microlenses, IEEE Journal of Selected Topics in Quantum Electronics, vol. 15, No. 4 (2009) 1218-1225.

K.Y. Ko et al., Enhanced Light Extraction from SrGa2S4:Eu2+ Film Phosphors Coated with Various Sizes of Polystyrene Nanosphere Monolayers, J. Phys. Chem. C, 112 (2008) 7594-7598.
Abstract, JP 2005268323, Sep. 9, 2005.

* cited by examiner

LED WAVELENGTH-COVERTING PLATE WITH MICROLENSES IN MULTIPLE LAYERS

TECHNICAL FIELD

The present application relates to light emitting diode (LED) light sources and, more particularly, to an LED wavelength-converting plate with microlenses in multiple layers.

BACKGROUND

Known LED chips generate light in a specific region of the light spectrum. The light output from the LED may be, for example, blue, red or green, depending on the material composition of the LED. When it is desired to construct an LED light source that produces a color different from the output color of the LED, it is known to convert the LED light output having a peak wavelength (the "primary light") to light having a different peak wavelength (the "secondary light") using luminescence/fluorescence.

The luminescent/fluorescence process involves absorbing the primary light by a wavelength-converting material such as a phosphor or mixture of phosphors thereby exciting the phosphor material, which emits the secondary light. The peak wavelength of the secondary light depends on the type of phosphor material, which can be chosen to provide secondary light having a particular peak wavelength. This process may be generally referred to as "wavelength conversion" and an LED combined with a wavelength-converting material, such as phosphor, to produce secondary light, may be described as a "phosphor-converted LED" or "wavelength-converted LED."

In a known configuration, an LED die, such as a III-V nitride die, is positioned in a reflector cup package and a volume, conformal layer or thin film including wavelength-converting material is deposited directly on the surface of the die. In another known configuration, the wavelength-converting material may be provided in a solid, self-supporting flat plate, such as a ceramic plate, single crystal plate or thin film structure. The plate may be attached to the LED, e.g. by wafer bonding, sintering, gluing, etc. Such a plate may be referred to herein as a "wavelength-converting plate." Another known approach is to provide the wavelength-converting material in a solid, self-supporting dome formed separately from the LED and attached thereto.

For design and/or cost reasons, a wavelength-converting plate configuration may sometimes be desirable. One drawback associated with using a wavelength-converting plate is that the wavelength-converting material at the periphery of the plate may receive less excitation from the primary light than the wavelength-converting material at the center of the plate. In addition, the path length of the primary light inside the said plate increases with changes in viewing angle from 0 degrees to the normal (typically defined at 90 degrees to the top surface of the wavelength-converting plate) to higher angles. These effects may contribute to different color light being emitted at angles close to the normal compared to the higher angles, which is known as color angular spread or color separation ($\Delta Cx$, $\Delta Cy$). For a well-known converter material, YAG:Ce, wavelength-converting plate and an InGaN LED chip, for example, bluer light may be emitted at angles near normal to the chip while yellower light may be emitted angles far from the normal.

BRIEF DESCRIPTION OF THE DRAWINGS

Reference should be made to the following detailed description which should be read in conjunction with the following figures, wherein like numerals represent like parts.

DETAILED DESCRIPTION

A wavelength-converting plate consistent with the present disclosure generally includes a plurality of microlenses deposited thereon in multiple layers. The wavelength-converting plate may be combined into a wavelength-converted LED package whereby light emitted by an LED passes through the bottom surface of the plate and through the microlenses deposited on the plate. Compared to an uncoated plate, the microlenses reduce angular color spread in the light output from the top surface of the wavelength-converting plate without significantly reducing efficacy.

Figure 1:
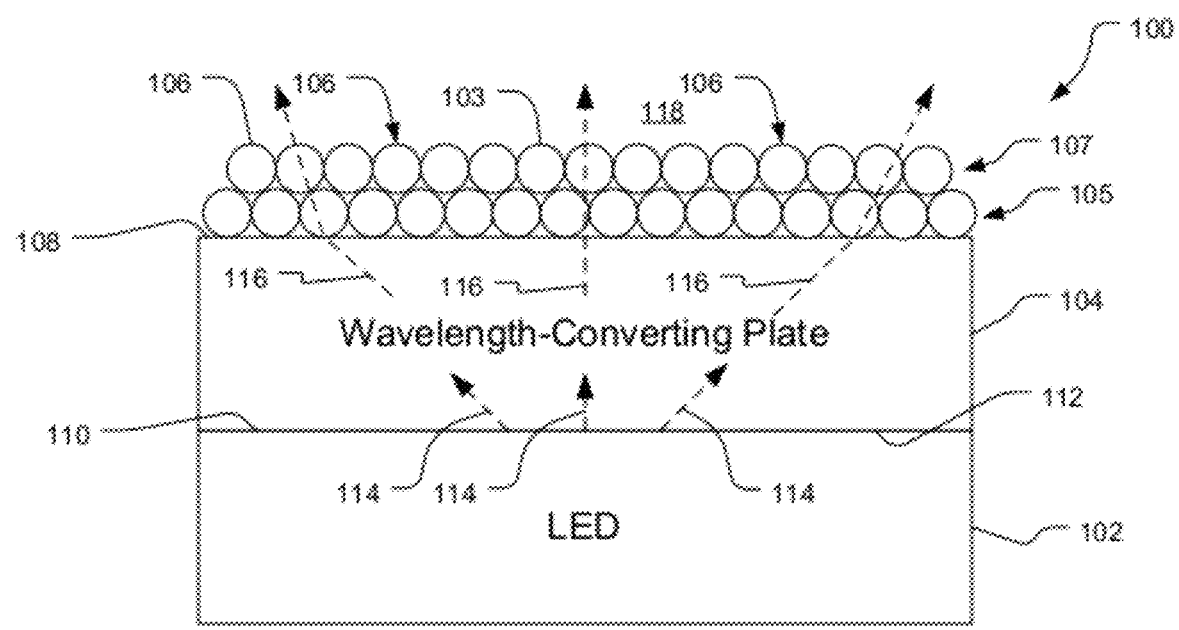
FIG. 1 diagrammatically illustrates one embodiment of a wavelength-converted LED including a wavelength-converting plate consistent with the present disclosure.

FIG. 1 diagrammatically illustrates a wavelength-converted LED assembly 100 consistent with the present disclosure. The illustrated assembly includes a known LED 102 and a wavelength-converting plate 104 having a plurality of microlenses 106 deposited on a top surface 108 thereof in multiple layers 105,107 consistent with the present disclosure. The LED 102 emits primary light at a peak wavelength through an emitting surface 110 thereof. The bottom surface 112 of the wavelength-converting plate 104 is positioned in opposed facing relationship to the emitting surface 110 of the LED 102. It is to be understood that FIG. 1 is provided in diagrammatic form for ease of illustration and explanation, and, for example, the bottom surface 112 of the wavelength converting plate 104 and the emitting surface 110 the LED 102 may have substantially different (roughened, structured, etc.) character from the indicated flat/polished surfaces, depending on the desired optical out-coupling and in-coupling.

Primary light e.g. indicated by arrows 114, emitted from the emitting surface 110 of the LED 102 passes through the bottom surface 112 of the wavelength-converting plate 104 and excites wavelength-converting material therein, which emits the secondary light, e.g. indicated by arrows 116. The secondary light (and perhaps some of the primary light) passes through the top surface 108 of the wavelength-converting plate 104 and passes through the layers 105, 107 of microlenses 106. The microlenses 106 reduce the angular color spread in the light output from the top surface 108 of the wavelength-converting plate 104 compared use of a wavelength-converting plate 104 without the microlenses 106. In one embodiment, the index of refraction of the microlenses 106 is different from the index of refraction of the wavelength-converting plate 104.

The LED 102 may be any known LED, including, but not limited to a nitride III-V LED such as an InGaN LED. The wavelength-converting plate 104 may take any known wavelength-converting plate configuration and is generally a self-supporting flat plate, such as a ceramic plate, single crystal plate or thin film structure having a wavelength-converting material or mixture of wavelength-converting materials therein. In one embodiment, the wavelength-converting plate 104 may be constructed in a known manner from a ceramic material and the wavelength-converting material in the wavelength-converting plate 104 may be a known phosphor or mixture of phosphors. Known wavelength-converting plate compositions include, but are not limited to, YAG:Ce, LuAG:Ce, Sr—SiON:Eu, etc., which may be formed into a wavelength-converting plate using known ceramic, thin film deposition or crystal growth methods. Again, the LED 102 and the wavelength-converting plate 104 may have substantially different (roughened, structured, etc.) surface characteristics from the illustrated surface characteristics, depending on the desired out-coupling and in-coupling.

The wavelength-converting plate 104 may be coupled in a known manner to the LED 102 so that light from the light emitting surface 110 of the LED 102 passes through the bottom surface 112 of the wavelength-converting plate 104. Known methods of coupling a wavelength-converting plate to an LED include, for example, wafer bonding, sintering, gluing, etc. Examples of ceramic wavelength-converting plates, wavelength-converting materials useful therein, and methods of constructing a wavelength-converting LED incorporating such plates are described in U.S. Pat. Nos. 7,554,258 and 7,361,938 the teachings of which are incorporated herein by reference.

The microlenses 106 on the wavelength-converting plate 104 may be discrete elements having a size, shape and/or refractive index chosen to allow reduced color angular spread of the light emitted from the top surface 108 of the wavelength-converting plate 104 compared to the color angular spread in the absence of the microlenses 106. The microlenses 106 may be formed from a variety of materials or mixture of materials, including materials having a refractive index the same as or similar to the wavelength converting plate 104, in any of a variety of shapes. In one embodiment, the microlenses 106 may be formed from a different material than the wavelength-converting plate 104 and may have a refractive index between the refractive index of the wavelength-converting plate 104 and the medium 118 (e.g. air having index of refraction of about 1.0003) contacting the top surface 103 of the microlenses 106 in layer 107.

The microlenses 106 may be discrete monospheres, e.g. as illustrated in FIG. 1, formed, for example, of silica or a polymer including, but not limited to polymethylmethacrylate (PMMA) or polystyrene (PS). Other polymer or non-polymer materials, such as silicone, YAG or alumina particles, may be used to form the microlenses 106. Particles useful as microlenses 106 consistent with the present disclosure may be commercially available from a variety of sources, such as Polysciences, Inc., Warrington, Pa., or may be synthesized by known methods. For example, PMMA and PS microlenses may be synthesized using a known emulsifier free emulsion polymerization process. In one example of such a process, monospherical PMMA microlenses having a diameter of approximately 350 nm may be synthesized by providing 100 mL of deionized water and 25 mL of methyl methacrylate in a 250 mL multi-necked round-bottom flask. The mixture may be stirred and bubbled with nitrogen while the temperature of the mixture is increased to about 70 degrees Celsius. When the temperature is stabilized, 0.09 g of initiator, 2,2'-azobis(2-methylpropionamidine)dihydrochloride, may be dissolved in 5 mL of water and added to the flask. After about two hours the heat may be removed, and the contents of the flask may be filtered through glass wool and briefly cooled in a freezer. The spheres may then be washed and isolated for depositing on the wavelength-converting plate.

The largest dimension of each microlens 106, e.g. the diameter in the case of spherical microlenses, may be on the order of the peak wavelength of the light emitted by the LED chip. In one embodiment, for example, the diameter of spherical microlenses may be between 100 nm and 70 µm. The microlenses 106 may each have approximately the same dimension, e.g. diameter, or the dimensions of the microlenses 106 may be different.

Figure 2:
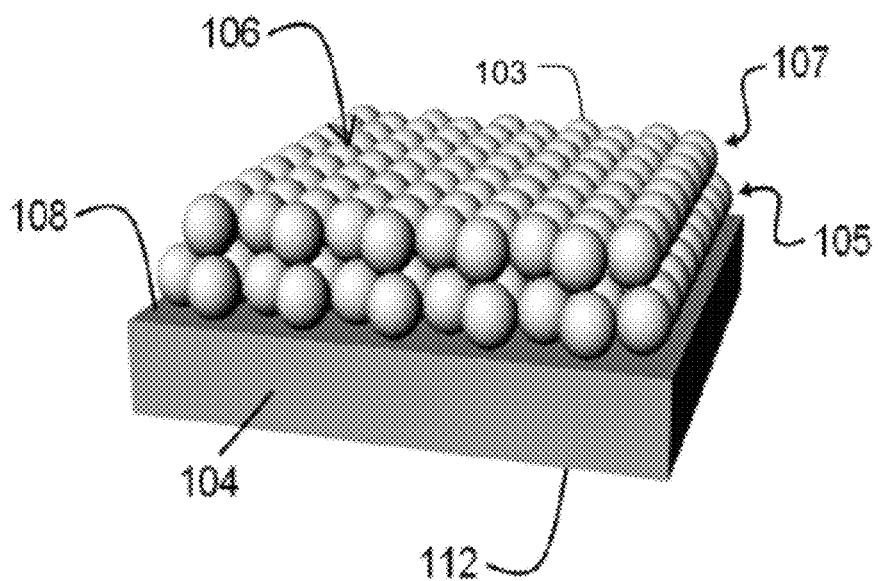
FIG. 2 diagrammatically illustrates the wavelength-converting plate shown in FIG. 1 in perspective view.

FIG. 2 diagrammatically illustrates, in perspective view, the first 105 and second 107 layers of microlenses 106 on the wavelength-converting plate 104 consistent with the present disclosure. Although the illustrated embodiment includes only two layers 105, 107, any number of layers may be provided. Subsequent layers on top of layer 107 may include microlenses 106 of the same material, index of refraction, size and/or shape as those in layer 105 and/or layer 107, or may be formed of microlenses of a different material, index of refraction, size and/or shape as those in layer 105 and/or layer 107. In one embodiment, for example, the index of refraction for each layer of microlenses 106 may be between the index of refraction of the layer on which it is disposed and the layer or medium in contact with the top surfaces of the microlenses forming the layer.

In the illustrated embodiment, the microlenses 106 in the layers 105, 107 are configured as discrete monospheres deposited on the top surface 108 of the wavelength-converting plate 104. As shown, the microlenses 106 in each layer 105, 107 may be closely packed. Although the microlenses 106 are not required to be in a closely contacting relationship to each other as shown in FIGS. 1 and 2, the closer the layers are packed, i.e. the closer the microlenses 106 are to each other, the better the coupling of light from the wavelength-converting plate 104 through the microlenses 106.

Figure 3:
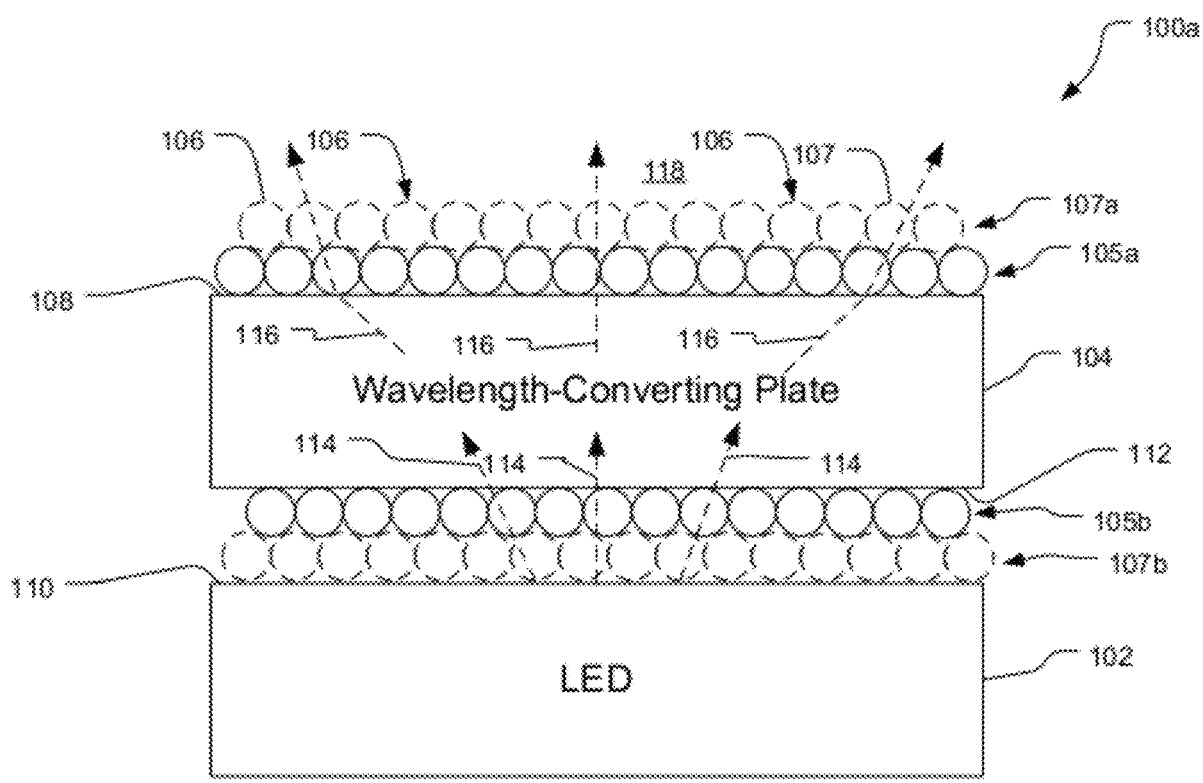
FIG. 3 diagrammatically illustrates another embodiment of a wavelength-converted LED including a wavelength-converting plate consistent with the present disclosure.

Multiple layers of microlenses may be provided only on the top surface 108 wavelength-converting plate 104, as shown in FIG. 1, or only on the bottom surface 112 of the wavelength-converting plate 104, or on both the top 108 and bottom 112 surfaces of the wavelength-converting plate 104. FIG. 3 diagrammatically illustrates a wavelength-converted LED assembly 100a consistent with the present disclosure including layers 105a, 105b of microlenses on both the top 108 and bottom 112 surfaces of the wavelength-converting plate 104 and optional additional layers 170a, 107b on the top 108 and bottom 112 surfaces. In one embodiment, multiple layers may be deposited on the wavelength-converting plate 104 by depositing only one layer 105a on the top surface 108 and one layer 105b on the bottom surface 112 of the wavelength-converting plate 104. In another embodiment, multiple layers 105a, 107a or 105b, 107b may be provided on one surface of the wavelength-converting plate 104 with only a single layer 105a or 105b on the opposed surface of the plate.

The total thickness of the multiple layers of lenses can be adjusted by selection of the dimensions of the microlenses 106 and/or the number of layers provided on the wavelength-converting plate 104. In general, the total the total thickness of the layers may be selected based on desired performance. If efficacy of the light source, i.e. lumens-per-watt (LPW), is more important in a particular configuration, then the total thickness of the multiple layers may be relatively small. However, if reducing angular color spread is more important, the total thickness of the multiple layers may be relatively large. In one embodiment, for example, the total thickness of the layers may be between about 200 nm and 140 µm, depending on the desired performance.

Figure 4:
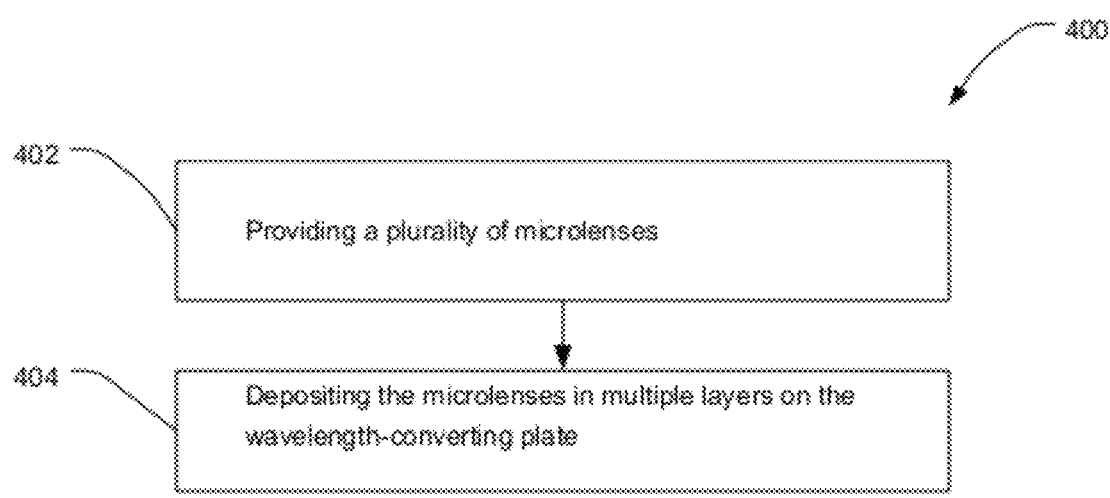
FIG. 4 is a block flow diagram illustrating one method of reducing angular color spread in a wavelength-converted LED assembly consistent with the present disclosure.

FIG. 4 is a block flow diagram illustrating an exemplary method 400 consistent with the present disclosure. The illustrated block flow diagram may be shown and described as including a particular sequence of steps. It is to be understood, however, that the sequence of steps merely provides an example of how the general functionality described herein can be implemented. The steps do not have to be executed in the order presented unless otherwise indicated.

As shown in FIG. 4, in a method 400 consistent with the present disclosure microlenses may be provided 402. The microlenses may have an index of refraction different from the index of refraction of a wavelength-converting plate. Multiple layers of microlenses may be deposited 404 on the wavelength-converting plate. Depositing of the microlenses in multiple layers may be accomplished using a variety of known means, including but not limited to drop-casting, dip-coating, spin-coating, evaporation-induced self-assembly (EISA), inverse Langmuir-Blodgett transfer or electrophoretic deposition.

Figure 5:
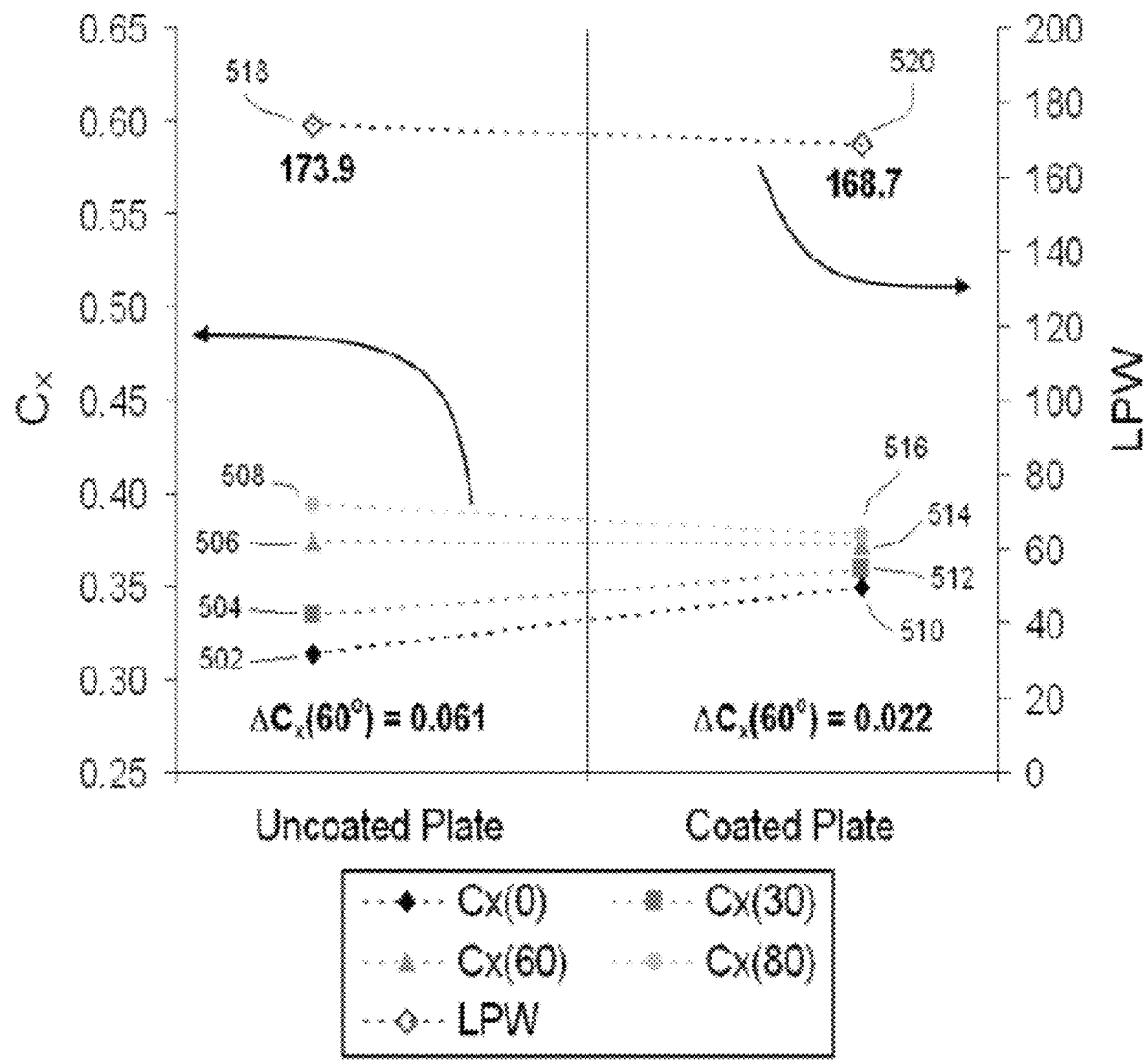
FIG. 5 includes plots of lumens-per-watt (LPW) and color point (Cx) illustrating performance of a wavelength-converting plate consistent with the present disclosure.

FIG. 5 includes plots of lumens-per-watt (LPW) and color point (Cx) associated with a wavelength-converted LED assembly including an LED and an uncoated wavelength-converting plate and also with a wavelength-converted LED assembly including the same LED but including a coated wavelength-converting plate 104 with multiple layers of microlenses 106 thereon consistent with the present disclosure. The coated wavelength-converting plate associated with the data in FIG. 5 was coated on only the top surface thereof with multiple layers of PMMA monospherical microlenses having a diameter of about 350 nm to achieve a total thickness for the multiple layers of about 1.5 µm. The layers were deposited on the top surface of the plate using EISA with a 1% by weight suspension of the PMMA microlenses.

Points 502, 504, 506 and 508, respectively, correspond to the measured color point (Cx) at 0, 30, 60 and 80 degrees from normal to the top surface of the wavelength-converting plate when the assembly included the uncoated wavelength-converting plate, and points 510, 512, 514, 516, respectively, correspond to the measured color point (Cx) at 0, 30, 60 and 80 degrees from normal to the top surface of the wavelength-converting plate when the assembly included the coated wavelength-converting plate. The difference in the color point (Cx) over a particular angular range represents angular color spread. As shown, for the uncoated plate the angular color spread over range of 60 degrees from normal, $\Delta$Cx (60), is equal to about 0.061. In contrast, $\Delta$Cx (60) associated with the coated wavelength-converting plate is only 0.022. A wavelength-converting plate consistent with the present disclosure thus provides reduced angular color spread compared to an uncoated plate. For the illustrated embodiment, the reduction in color spread resulted in only a minimal reduction in the efficacy, measured in units of lumens-per-watt (LPW). As shown at points 518 and 520, respectively, the uncoated plate exhibited about 174 LPW whereas the coated plate exhibited about 169 LPW.

There is, therefore, provided a wavelength-converting plate including a plurality of microlenses deposited in multiple layers thereon. The wavelength-converting plate may be combined into a wavelength-converted LED package whereby light emitted by an LED passes through the bottom surface of the plate and through the microlenses deposited on the plate. The microlenses may generally allow for reduced angular color spread, $\Delta$Cx, compared to wavelength-converting plate without microlenses thereon.

According to one aspect of the disclosure, there is provided a light source including a light emitting diode (LED) configured to emit primary light from an emitting surface and a wavelength-converting plate having a bottom surface in opposed facing relationship to the light emitting surface of the LED. The wavelength-converting plate has a wavelength-converting material therein configured to emit secondary light in response to the primary light being imparted thereon. A plurality of microlenses are deposited in multiple layers on the wavelength-converting plate. The microlenses may have an index of refraction different from an index of refraction of the wavelength-converting plate.

According to another aspect of the disclosure, there is provided a wavelength-converting plate for a wavelength-converted light emitting diode (LED) assembly including an LED configured to emit primary light. The wavelength-converting plate includes a top surface and a bottom surface. The bottom surface is configured for positioning in opposed facing relationship to an emitting surface of the LED. A wavelength-converting material is provided in the plate and is configured to emit secondary light through the top surface in response to the primary light being imparted thereon. A plurality of microlenses are deposited in multiple layers on the wavelength-converting plate. The microlenses may have an index of refraction different from an index of refraction of the wavelength-converting plate.

According to another aspect of the disclosure, there is provided a method of reducing angular color spread in a wavelength-converted LED assembly wherein the wavelength-converting plate is configured to receive primary light from the LED and provide secondary light through the top surface in response thereto. The method includes providing a plurality of microlenses, which may have an index of refraction different from the index of refraction of the wavelength-converting plate; and depositing multiple layers of the microlenses on the wavelength-converting plate.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A light source comprising:
a light emitting diode (LED) configured to emit primary light from an emitting surface;
a wavelength-converting plate having a bottom surface in opposed facing relationship to said emitting surface of said LED, said wavelength-converting plate having a wavelength-converting material therein configured to emit secondary light in response to said primary light being imparted thereon; and
a plurality of microlenses deposited in multiple layers on said bottom surface of said wavelength-converting plate.

2. A light source according to claim 1, wherein said microlenses have an index of refraction different from an index of refraction of said wavelength-converting plate.

3. A light source according to claim 1, wherein said multiple layers are further deposited on a top surface of said wavelength-converting plate.

4. A light source according to claim 1, wherein a total thickness of said multiple layers is between 200 nm and 140 µm.

5. A light source according to claim 1, wherein said microlenses are monospheres.

6. A light source according to claim 5, wherein said monospheres have a diameter between about 100 nm and 70 µm.

7. A wavelength-converting plate for a wavelength-converted light emitting diode (LED) assembly including an LED configured to emit primary light, said wavelength-converting plate comprising:
a top surface and a bottom surface, said bottom surface for positioning in opposed facing relationship to an emitting surface of the LED, and a wavelength-converting material configured to emit secondary light through the top surface in response to the primary light being imparted thereon; and
a plurality of microlenses deposited in multiple layers on said bottom surface of the wavelength-converting plate.

8. A wavelength-converting plate according to claim 7, wherein said microlenses have an index of refraction different from an index of refraction of said wavelength-converting plate.

9. A wavelength-converting plate according to claim 8, wherein said multiple layers are further deposited on said top surface of said wavelength-converting plate and said microlenses on said top surface have an index of refraction between an index of refraction of said wavelength-converting plate and an index of refraction of a medium in contact with a top surface of said microlenses.

10. A wavelength-converting plate according to claim 8, wherein a total thickness of said multiple layers is between 200 nm and 140 µm.

11. A wavelength-converting plate according to claim 8, wherein said microlenses are monospheres.

12. A wavelength-converting plate according to claim 11, wherein said monospheres have a diameter between about 100 nm and 70 µm.

13. A wavelength-converting plate according to claim 8, wherein said microlenses are comprised of at least one of silica, a polymer, silicone, yttrium aluminum garnet (YAG), or alumina.

14. A wavelength-converting plate according to claim 13 wherein the polymer is polymethylmethacrylate (PMMA) or polystyrene (PS).

* * * * *